Figure 1:
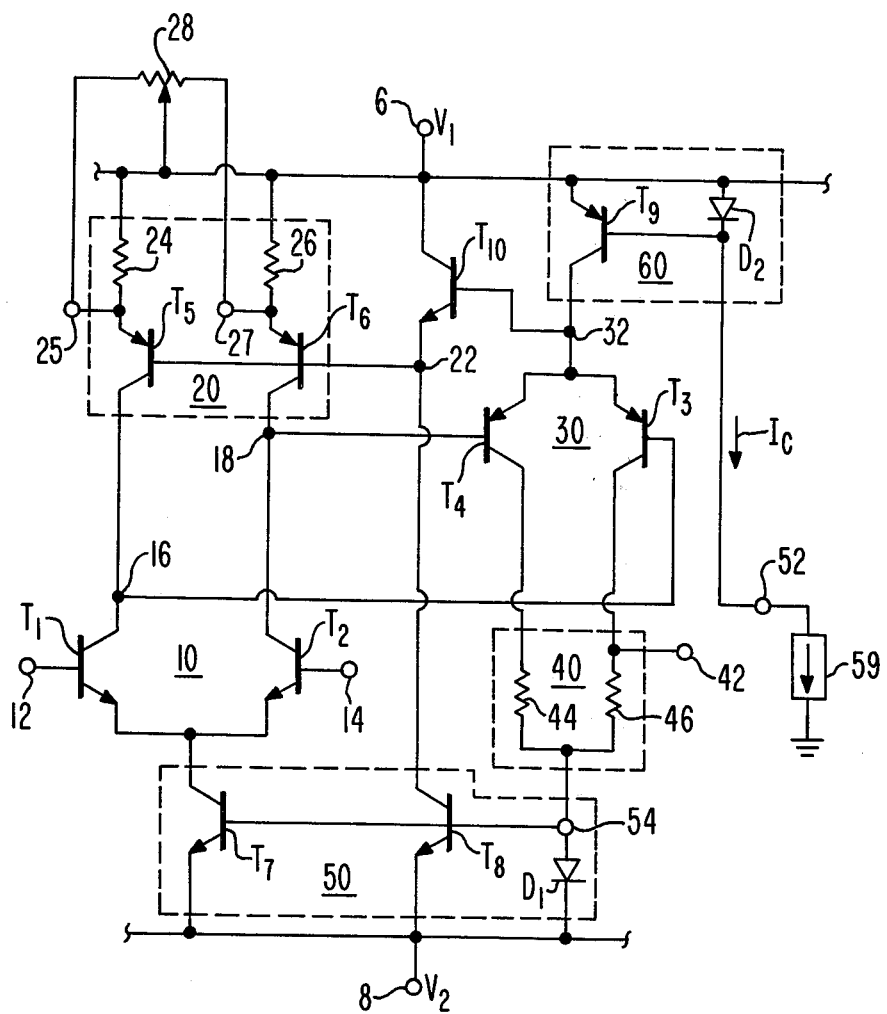

United States Patent [19]
Wittlinger

[11] 4,272,728
[45] Jun. 9, 1981

[54] DIFFERENTIAL-INPUT AMPLIFIER CIRCUIT

[75] Inventor: Harold A. Wittlinger, Pennington, N.J.

[73] Assignee: RCA Corporation, New York, N.Y.

[21] Appl. No.: 70,510

[22] Filed: Aug. 28, 1979

[51] Int. Cl.³ ............................................. H03F 3/45
[52] U.S. Cl. .................................... 330/253; 330/257; 330/258; 330/261
[58] Field of Search ................ 330/253, 257, 258, 261

[56] References Cited

U.S. PATENT DOCUMENTS

| Re. 27,351 | 5/1972 | McGraw et al. | 330/258 |
|---|---|---|---|
| 3,564,439 | 2/1971 | Rao | 330/257 |
| 3,614,645 | 10/1971 | Wheatley, Jr. | 330/255 |
| 3,876,955 | 4/1975 | Ahmed | 330/257 |
| 3,946,325 | 3/1976 | Leidich | 330/258 |
| 3,979,689 | 9/1976 | Schade, Jr. | 330/257 |
| 4,007,427 | 2/1977 | Leidich | 330/257 |
| 4,101,842 | 7/1978 | Ohsawa | 330/257 |

Primary Examiner—James B. Mullins
Attorney, Agent, or Firm—P. J. Rasmussen; P. M. Emanuel; Clement A. Berard, Jr.

[57] ABSTRACT

A plural-stage amplifier circuit having improved common-mode input voltage range includes first and second transistors connected to form a first long-tailed pair, third and fourth transistors connected to form a second long-tailed pair in cascade connection after the first long-tailed pair, a first current supply providing tail current to the first long-tailed pair, a second current supply having a plurality of outputs providing collector currents to the first long-tailed pair, and a third current supply providing tail current to the second long-tailed pair. The output currents of the first, second and third current supplies are controlled in proportion to a control current which permits the voltage across the third current supply to be controlled such that the first and second transistors do not saturate at input voltages approaching the supply voltage.

16 Claims, 5 Drawing Figures

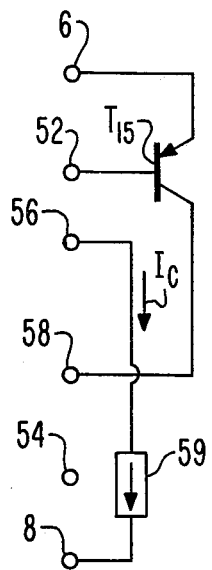
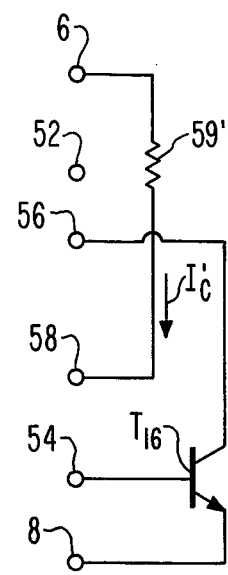
Fig. 3. Fig. 4.
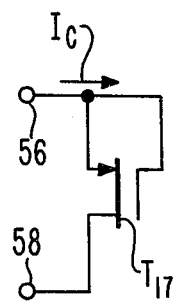
Fig. 5.

DIFFERENTIAL-INPUT AMPLIFIER CIRCUIT

The invention relates generally to differential-input amplifiers with a plurality of long-tailed-pair stages in cascade connection and, more particularly, to improved circuitry for maintaining a tracking relationship between the currents in those stages.

C. F. Wheatley, Jr. in U.S. Pat. No. 3,614,645 patented Oct. 19, 1971 and entitled "OPERATIONAL TRANSCONDUCTANCE AMPLIFIER" describes an amplifier using such a cascade connection of long-tailed-pair stages. The described embodiments of the Wheatley invention employ bipolar transistors. Tracking of the currents in first and second long-tailed-pair stages is achieved using a dual-output current mirror amplifier (CMA) to provide common-mode feedback from the tail connection of the second long-tailed pair, at the interconnected emitter electrodes of the transistors in this pair, to their respective base electrodes. More particularly, the input connection of the dual-output CMA is at the tail connection of the transistors in the second long-tailed pair, and the output connections of the CMA are connected to provide active loads to the collectors of transistors associated with the first long-tailed pair, which connect to respective ones of the base electrodes of the transistors in the second long-tailed pair. This common-mode feedback maintains the tail current of the second long-tailed pair in a fixed ratio with the combined collector currents of the transistors of the first long-tailed pair, which combined collector currents are determined by the tail current in the first long-tailed pair, this fixed ratio being related in inverse proportion to the current gain of the CMA. This arrangement with the dual output CMA permits the programming of the proportional current levels in the first and second long-tailed pairs over a wide range, responsive to programming of the tail current to the first long-tailed pair, so that one may use the amplifier with any selected load resistance for the second stage. This selection is made to obtain required band-width without requiring excess quiescent current levels, as would undesirably boost d-c power consumption by the amplifier.

Wheatley, Jr., shows the tail current of the first long-tailed pair being conducted by the output circuit of another CMA, the input circuit of which is adapted to receive a programming current $I_{ABC}$. $I_{ABC}$ may be a direct current when the long-tailed-pair cascade connection is to be used for straight amplification, or may be a changing unidirectional current when analog multiplication or amplitude modulation is to be carried forward by the cascade connection.

The use of the dual-output CMA to maintain proportionality between the common-mode quiescent currents in the first and second long-tailed-pair stages is not entirely satisfactory in certain applications. For example, it interferes with the trimming of emitter currents of the transistors used as active collector loads for transistors in the first long-tailed pair, inasmuch as the transistors used as active loads when included in the output circuits of a CMA have to conduct in proportion to a transistor in the input circuit of the CMA. The use of this CMA may reduce the common-mode range of input signal voltages to the first long-tailed pair, particularly where the active collector loads for its transistors are provided by cascode arrangements of complementary-conductivity transistors, as another example.

The present invention is embodied in a first long-tailed-pair connection of transistors of one conductivity type followed in direct coupled cascade by a second long-tailed-pair connection of transistors of another complementary conductivity type. Common-mode feedback from the tail connection of the second long-tailed pair transistors adjusts the sum of the currents in the active collector loads of transistors in the first long-tailed-pair stage to appropriate value as in the Wheatley, Jr. circuitry. The common-mode feedback is predominantly voltage-mode rather than predominantly current-mode in nature, however, so the common-mode feedback does not adjust the ratio of tail currents in the first and second long-tailed-pair stages. Instead, feedforward arrangements are used to provide proportionally tail currents to the first and second long-tailed-pair connections.

Figure 2:
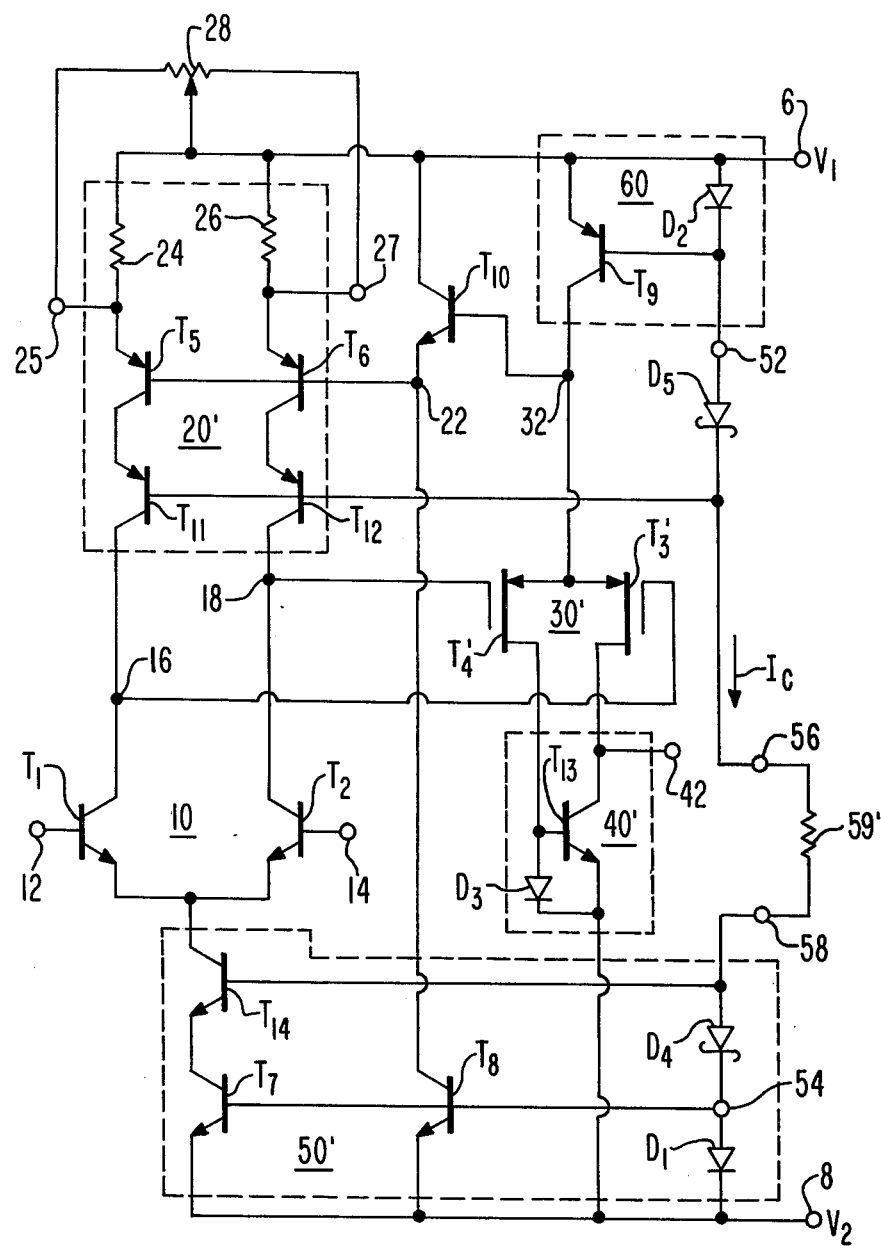

In the drawings:

Each of FIGS. 1 and 2 is a schematic diagram of an amplifier circuit embodying the present invention;

FIGS. 3, 4, and 5 are schematic diagrams of modifications of the FIG. 2 circut resulting in further embodiments of the present invention.

In FIG. 1, NPN bipolar transistors $T_1$ and $T_2$, interconnected at their emitters to form long-tailed-pair amplifier 10, receive input signals from terminals 12 and 14 at their respective bases. Tail current is withdrawn from the emitters of $T_1$ and $T_2$ by constant current generator 50. Their respective collector currents are supplied from the collectors of PNP bipolar transistors $T_5$ and $T_6$ included in current supply 20. The emitters of transistors $T_5$ and $T_6$ are connected to relatively positive voltage supply 6 through resistors 24 and 26 respectively. The voltage drops across resistors 24 and 26 are typically substantially lower than the operating base-to-emitter voltages of transistors $T_5$ and $T_6$. The bases of $T_5$ and $T_6$ connect together to receive a control voltage from node 22. This control voltage developed by a common-mode feedback connection, described in greater detail hereafter, controls the current flows in $T_5$ and $T_6$ such that they substantially equal the respective collector current demands of $T_1$ and $T_2$.

Amplified signals at nodes 16 and 18, responsive to the input signals from terminals 12 and 14, are applied to long-tailed-pair 30, including PNP bipolar transistors $T_3$ and $T_4$. Tail current is received from constant current generator 60 at tail connection 32 to which the emitters of transistors $T_3$ and $T_4$ connect.

The respective collectors of $T_3$ and $T_4$ connect to relatively negative supply terminal 8 via current conductive connection means 40 including resistors 44 and 46. Connection means 40 also provides a source of output signals from long-tailed pair 30, shown by way of example as terminal 42.

Tail connection 32 is direct-coupled to node 22 by the emitter-follower action of NPN transistor $T_{10}$ to provide a common-mode feedback connection. This common-mode feedback connection completes feedback loops which adjust the sum of the collector currents of $T_5$ and $T_6$ to equal the sum of the collector currents of $T_1$ and $T_2$ (ignoring the relatively small error currents from the bases of $T_3$ and $T_4$ which also flow as collector currents to $T_1$ and $T_2$, respectively).

More particularly, if the currents supplied by $T_5$ and $T_6$ tend to be too great, the voltages at nodes 16 and 18 tend move in a direction toward supply voltage $V_1$. That tendency couples through long-tailed-pair 30 ($T_3$ and $T_4$ act as emitter-followers for the common-mode voltage) tending to move the voltage at node 32 towards supply voltage $V_1$. Emitter-follower action by $T_{10}$ causes the voltage at node 22 to move in the same direction, reducing the base-emitter potentials of $T_5$ and $T_6$. That tends to decrease their collector currents until balance between the collector currents demanded by $T_1$, $T_2$ and the collector currents supplied by $T_5$, $T_6$ is achieved. In this manner the currents supplied by current supply 20 are proportional to the collector currents demanded by $T_1$ and $T_2$, which currents are proportional to the combined emitter current supplied by current supply 50.

The common-mode feedback used in FIG. 1 is essentially voltage feedback, in contrast to common-mode feedback through a CMA, which is essentially current feedback. The tail current to long-tailed-pair 30 is controlled by constant current generator 60 rather than by the common-mode feedback connection.

The base-emitter potential $V_{BE10}$ of $T_{10}$ is poled such that the potential across current supply 60 is substantially less than the respective base-emitter potentials $V_{BE5}$ and $V_{BE6}$ of transistors $T_5$ and $T_6$. E.g., if $V_{BE5}$, and $V_{BE10}$ are substantially equal, then the voltage across current-source $T_9$ is substantially equal to the low voltage across resistors 24 and 26. Thus, the potential drop across constant current generator 60 is established at a low value.

That low operating potential across constant current generator 60 establishes the operating potential at the tail connection 32 of long-tailed-pair 30 which determines, via the base-emitter offset voltages of $T_3$ and $T_4$, the operating potentials at the collectors of $T_1$ and $T_2$. As the common-mode input voltage at terminals 12 and 14 approaches supply voltage $V_1$, the collector-to-base potentials of transistors $T_1$ and $T_2$ correspondingly decrease. The maximum common-mode input voltage at which the amplifier operates linearly corresponds to that voltage where the collector-to-emitter potentials of $T_1$ and $T_2$ reach the saturation threshold. Thus, the maximum common-mode input voltage is given by $$V_{CM} = V_1 - V_{24} - V_{BE5} + V_{BE10} - V_{BE3} - V_{SAT1} + V_{BE1} \quad [1]$$

where:
  $V_{24}$ represents the voltage drop across resistor 24,
  $V_{BEi}$ represents the forward-bias, base-emitter voltage of transistor $T_i$, and
  $V_{SAT1}$ is the collector-to-emitter saturation-threshold voltage of transistor $T_1$.

For silicon transistors having 0.6 volt base-emitter conduction voltages and 0.2 volt saturation threshold voltages, the maximum common-mode input voltage is $V_{CM} = V_1 - 0.4$ volt typically. In prior art circuits where the emitters of $T_3$ and $T_4$ connect to the bases of $T_5$ and $T_6$, as taught by Wheatley, Jr., $V_{CM}$ typically does not exceed $V_1 - 1.0$ volt.

Common-mode feedback of the sort described in the preceding paragraph precludes the use of Wheatley, Jr.'s circuitry for tracking the common-mode current levels in long-tailed-pair stages 10 and 30. The inclusion of the resistors 24 and 26 to permit trimming balance by applying currents via potentiometer 28 to terminals 25 and 27 at the emitters of $T_5$ and $T_6$ also tends to be incompatible with Wheatley, Jr.'s circuitry for tracking current levels in long-tailed-pair stages. This tendency towards incompatibility exists even if tail connection 32 is direct coupled to node 22 by means other than the emitter-follower action of $T_{10}$—e.g., by direct connection without substantial intervening resistance.

In accordance with the present invention, a feed-forward circuit is used to track the currents generated by constant current generators 50 and 60. Constant current generator 60 is shown as a CMA comprising a semiconductor diode $D_2$ and a PNP transistor $T_9$ acting as current-to-voltage and voltage-to-current converters, respectively. $D_2$ responds to control current $I_C$ demanded at terminal 52 by a source of programming current 59 to apply a base-emitter potential to $T_9$ that conditions $T_9$ to supply a collector current proportionally related to $I_C$. (Current source 59 may take so simple a form as a resistor connecting terminals 52 and 8, for example.) The collector currents of $T_3$ and $T_4$ (identical to their respective emitter currents except for base currents, which are respectively negligibly small for modern transistors) flow through connection means 40 to be combined into a current substantially equal to the current supplied tail connection 32.

This current flows to the input connection 54 of a CMA included within constant current generator 50. This CMA includes semiconductor diode $D_1$ used as a current-to-voltage converter and NPN transistors $T_7$ and $T_8$ used as voltage-to-current converters. This CMA demands a tail current from the connection between the emitters of $T_1$ and $T_2$ proportional to the current supplied to its input connection 54. The CMA also demands a further current proportional to its input current from the emitter of $T_{10}$ to maintain its emitter-follower action. $I_C$ is thus fed forward, being scaled by the CMA in constant current generator 60 to provide a proportionally related tail current to long-tailed-pair 30, being coupled by the common-base amplifier action of $T_3$ and $T_4$, and being scaled and reversed in direction by the CMA constant current generator 60 to provide a proportionally related tail current to long-tailed pair 10.

In FIG. 2, the long-tailed-pair 10 corresponds to that of FIG. 1. Long-tailed-pair 30' differs from long-tailed pair 30 in that field-effect transistors $T_3'$ and $T_4'$ are used instead of bipolar transistors $T_3$ and $T_4$. To take advantage of the high input resistance at the gates of $T_3'$ and $T_4'$ to increase the gain of amplifier 10, current source 20' is improved over current source 20 by the addition of common-base amplifier transistors $T_{11}$ and $T_{12}$. The bases of $T_{11}$ and $T_{12}$ connect to an operating potential, generated by way of example by the forward conduction voltages of diodes $D_2$ and $D_5$. $T_{11}$ and $T_{12}$ receive at their respective emitters the collector currents supplied by transistors $T_5$ and $T_6$ respectively and, in response thereto, supply the respective collector current demands of $T_1$ and $T_2$. Common-base amplifiers $T_{11}$ and $T_{12}$ increase the effective source resistance at each of the outputs of second current supply 20'.

Offset potential generating transistor $T_{10}$ and the common-mode degenerative feedback loop controlling the currents supplied by $T_5$ and $T_6$ operate as described for FIG. 1; the addition of common-base amplifiers $T_{11}$ and $T_{12}$ does not alter the operation of the common-mode voltage-feedback control loop. The potentials between nodes 16 and 32 and between nodes 18 and 32, correspond to the respective gate-to-source operating potentials of transistors $T_3'$ and $T_4'$, respectively. Thus, the maximum common-mode input voltage at terminals 12 and 14 is $V_{CM} = V_1 - 1.0$ volt for the circuit of FIG. 2. The low forward conduction potential of Schottky diode $D_5$, for example, further improves current supply 20' for maximum common-mode input voltage operation. In prior art circuits where the sources of $T_3'$ and $T_4'$ connect to the bases of $T_5$ and $T_6$, $V_{CM} = V_1 - 1.6$ volts typically.

Current conductive connection 40', including a current mirror amplifier wherein diode $D_3$ and transistor $T_{13}$ perform current-to-voltage and voltage-to-current conversion respectively, conducts the respective drain currents of $T_3'$ and $T_4'$ to supply terminal 8. Differential signals, responsive to the signals at nodes 16 and 18, superimposed on the drain currents of $T_3'$ and $T_4'$ are converted to single-ended signals at output terminal 42 by that current mirror amplifier.

Constant current generator 50' differs from constant current generator 50 in FIG. 1 in that common-base amplifier transistor $T_{14}$ withdraws tail current from long-tailed-pair 10 responsive to current withdrawn from its emitter by $T_7$. Its base receives an operating potential determined, by way of example, by the forward conduction drops of diode $D_1$ and Schottky diode $D_4$. Increased source resistance of constant current generator 50', achieved by the inclusion of common-base amplifier $T_{14}$, increases the common-mode rejection ratio of long-tailed-pair amplifier 10.

Tail currents for amplifiers 10 and 20' are established in fixed ratio by constant current generators 50' and 60 respectively responsive to control current $I_C$ being fed forward through resistor 59' from input terminal 52 of current supply 60 to input terminal 54 of current supply 50'. The value of $I_C$ is determined by Ohm's Law using the difference between supply voltages $V_1$ and $V_2$ less the forward-conduction voltages of diodes $D_1$, $D_2$, $D_4$ and $D_5$, and the value of resistor 59'.

In contrast to Wheatley, Jr., tail current for amplifiers 30 or 30' is generated in response to a signal which is independent of the common-mode feedback connections for balancing the currents in the current source loads of the first long-tailed pair. In the present invention, tail current in the first long-tailed pair may be dependent upon tail current in the second long-tailed pair responsive to a control current, or tail current in the second long-tailed pair may be dependent upon tail current in the first long-tailed pair responsive to a control current, or tail currents in the first and second long-tail pairs may be mutually dependent upon the control current.

FIGS. 3, 4 and 5 show alternative feed forward circuit configurations for coupling control current $I_C$ to constant current generators 50' and 60 when the numbered terminals in FIG. 2 are connected to like numbered terminals in FIG. 3, 4 or 5. In FIG. 3, control current $I_C$ establishes tail current for amplifier 30' and a current proportional to that tail current is fed forward to generate tail current for amplifier 10. Current generator 59 establishes current $I_C$ which flows from input terminal 52 of current mirror amplifier 60 via diode $D_5$ and terminal 56. Transistor $T_{15}$, connected at its base to input terminal 52 of current supply 60 and at its emitter to supply terminal 6, supplies at its collector a further output current from current mirror amplifier 60 responsive to control current $I_C$. Current from that further output is fed forward to terminal 58 and thence to input terminal 54 of current mirror amplifier 50' so that the output currents from current generators 50' and 60 are established in fixed ratio.

In FIG. 4, control current $I_C'$ establishes tail current for amplifier 10 and a current proportional to that tail current is fed forward to generate tail current for amplifier 30'. Resistor 59' establishes control current $I_C'$ supplied to the input circuit of constant current generator 50' via terminals 58 and 54. Transistor $T_{16}$ connected at its base to input 54 of current supply 50' and at its emitter to supply terminal 8, provides a further output at its collector from current mirror amplifier 50'. Output current demand at the collector of $T_{16}$ is fed forward to the input circuit of current mirror amplifier 60 via terminals 56 and 52 so that the output currents from current generators 50' and 60 are established in fixed ratio.

In FIG. 5, field-effect transistor $T_{17}$, connected in current source configuration by the connection of is gate and source in common, causes current $I_C$ to flow from terminal 56 to terminal 58. That current is thereby ed forward to current generators 50' and 60 so that the tail currents of amplifiers 10 and 30' are in fixed ratio.

The foregoing description includes several of the alternative embodiments discerned by the inventor; further embodiments not described will be apparent to one skilled in the art of design when armed with an understanding of the teachings of this disclosure. For example, the base-emitter operating potential of $T_{10}$ may be reduced to a value below that of $T_5$ and $T_6$ by reducing the emitter-current density in $T_{10}$ (relative to that in $T_5$, $T_6$) either by reducing the emitter current flowing in $T_{10}$ or by reducing the emitter area of $T_{10}$, or both. Thus, resistors 24 and 26 may be eliminated while still providing sufficient collector-emitter operating voltage for $T_9$.

Alternatively, $T_{10}$ provides suitable offsetting potential if diode connected as a semiconductor junction between nodes 32 and 22, as for example, by leaving its collector unconnected. Here, the collector current of $T_8$ is scaled to a predetermined magnitude for demanding base current from $T_5$ and $T_6$, and bias current from $T_{10}$, which bias current is less than the collector current of $T_9$.

What we claim is:
1. A differential-input amplifier comprising:
first and second transistors of a first conductivity type and third and fourth transistors of a second conductivity type complementary to said first conductivity type, each of said transistors having the ends of its principal conduction path defined by respective first and second electrodes thereof and having a respective third electrode, the conduction of its principal conduction path being controlled by potential between its first and third electrodes;
first and second input signal terminals for receiving input signal therebetween, said first input signal terminal being connected to the third electrode of said first transistor and said second input signal terminal being connected to the third electrode of said second transistor;
first controlled current source means for responding to a control signal to supply current to a first node, said first node having the second electrode of said first transistor connected thereto and being direct coupled to the third electrode of said third transistor, the current said first controlled current source supplies to said first node being of the polarity the second electrode of said first transistor normally conducts;
second controlled current source means for responding to said control signal to supply current to a second node, said seccond node having the second electrode of said second transistor connected thereto and being direct coupled to the third electrode of said fourth transistor, the current said second controlled current source supplies to said second node being of the polarity the second electrode of said second transistor normally conducts;

common-mode feedback means connected to respond to the common-mode component of the voltages at said first and second nodes to develop said control signal, completing degenerative voltage feedback loops that adjust the respective currents supplied to said first and second nodes by said first and second controlled current sources to substantially equal the currents flowing between said first and second nodes and the respective second electrodes of said first and second transistors;

conductive means for connecting the second electrodes of said third and fourth transistors to a first operating supply voltage, including means for responding to the variations in the current flowing through the second electrode of at least one of said third and fourth transistors to provide an output signal;

feed-forward means independent of said common-mode feedback means, supplying a first tail current to an interconnection of the first electrodes of said first and second transistors for completing their connection as a first long-tailed pair, and supplying a second tail current proportional to said first tail current to an interconnection of the first electrodes of said third and fourth transistors for completing their connection as a second long-tailed pair.

2. A differential-input amplifier as set forth in claim 1 wherein said feed forward means includes, in addition to said third and fourth transistors operating as common-third-electrode amplifiers and said conductive means, the following:

fifth and sixth transistors, respectively of said first and of said second conductivity types, each having the ends of its principal conduction path defined by respective first and second electrodes thereof and having a respective third electrode, the conduction of its principal conduction path being controlled by potential between its first and third electrodes, the second electrode of said fifth transistor being connected to said interconnection between the first electrodes of said first and second transistors, and the second electrode of said sixth transistor being connected to said interconnection between the first electrodes of said third and fourth transistors;

means for connecting the first electrode of said fifth transistor to said first operating supply voltage and for connecting the first electrode of said sixth transistor to a second operating supply voltage, respectively;

means responsive to the sum of the second electrode currents of said third and fourth transistors flowing through said conductive means for applying a voltage between the first and third electrodes of said fifth transistor, which voltage is so related to the sum of the second electrode currents of said third and fourth transistors as to condition said third transistor to conduct said first tail current through its principal conduction path, which first tail current is proportionally related to that sum; and means responsive to a control current for applying a voltage between the first and third electrodes of said sixth transistor, which voltage is so related to said control current as to condition said sixth transistor to conduct said second tail current through its principal conduction path, which second tail current is proportionally related to said control current.

3. A differential-input amplifier as set forth in claim 2 wherein said means for applying a voltage between the first and third electrodes of said fifth transistor comprises diode means connected between the first and third electrodes of said fifth transistor.

4. A differential-input amplifier as set forth in claim 2 wherein said means for applying a voltage between the first and third electrodes of said sixth transistor comprises diode means connected between the first and third electrodes of said sixth transistor.

5. A differential-input amplifier as set forth in claim 1 wherein said feed forward means comprises:

fifth and sixth transistors respectively, of said first and of said second conductivity types, each having the ends of its principal conduction path defined by respective first and second electrodes thereof and having a respective third electrode, the conduction of its principal conduction path being controlled by potential between its first and third electrodes, the second electrode of said fifth transistor being connected to said interconnection between the first electrodes of said first and second transistors, and the second electrode of said sixth transistor being connected to said interconnection between the first electrodes of said third and fourth transistors;

means for connecting the first electrode of said fifth transistor to said first operating supply voltage and for connecting the first electrode of said sixth transistor to a second operating supply voltage, respectively;

means responsive to a control current for applying voltage between the first and third electrodes of said fifth transistor, which voltage is so related to said control current as to condition said fifth transistor to conduct said first tail current through its principal conduction path, which first tail current is proportionally related to said control current; and means responsive to said control current for applying voltage between the first and third electrodes of said sixth transistor, which voltage is so related to said control current as to condition said sixth transistor to conduct said second tail current through its principal conduction path, which second tail current is proportionally related to said control current.

6. A differential-input amplifier as set forth in claim 5 wherein said means for applying a voltage between the first and third electrodes of said fifth transistor comprises diode means connected between the first and third electrodes of said fifth transistor.

7. A differential-input amplifier as set forth in claim 5 wherein said means for applying a voltage between the first and third electrodes of said sixth transistor comprises diode means connected between the first and third electrodes of said sixth transistor.

8. A differential amplifier as set forth in any of the preceding claims wherein said common-mode feedback means includes, in addition to said third and fourth transistors operating as third-electrode followers responsive to the common-mode voltage component of the signals at said first and second nodes, the following:

a further transistor of said first conductivity type having the ends of its principal current conduction path defined by respective first and second electrodes thereof, and having a responsive third electrode for controlling the conduction of its principal conduction path according to the potential between its first and third electrodes; and means connecting said further transistor as a potential follower including means for connecting the second electrode of said further transistor to said second operating supply voltage, means for connecting the third electrode of said further transistor to said interconnection between the first electrodes of said third and fourth transistors, and means for connecting the first electrode of said further transistor for supplying said control signal.

9. An amplifier circuit including:

first and second supply terminals for receiving operating voltage therebetween;

first and second transistors of like conductivity type to each other, each having base and emitter and collector electrodes;

third and fourth field-effect transistors of conductivity type complementary to that of said first and second transistors, each having gate and source and drain electrodes;

means for connecting said first and second transistors in first long-tailed-pair configuration including means for applying input signals to their respective base electrodes, and an interconnection between their respective emitter electrodes for receiving a first tail current;

means for connecting said third and fourth field-effect transistors in second long-tailed-pair configuration including means for connecting the respective collector electrodes of said first and second transistors to the respective gate electrodes of said third and fourth transistors, and an interconnection between the respective source electrodes of said third and fourth transistors for receiving a second tail current;

first current conductive means connecting the respective drain electrodes of said third and fourth transistors to said second supply terminal;

the improvement comprising:

first current mirror amplifying means having at least a first output connection, which first output connection supplies said first tail current to said first long-tailed pair, having an input connection for receiving a first control current for proportionately adjusting its output currents, and having a common connection to said second supply terminal;

constant current generator means having at least first and second output connections, which first and second output connections respectively connect to the respective collector electrodes of said first and second transistors for supplying their respective collector current demands, having an input connection for receiving a control voltage for proportionately adjusting its output currents, and having a common connection to said first supply terminal;

second current mirror amplifying means having at least a first output connection, which first output connection supplies said second tail current to said second long-tailed pair, having an input connection for receiving a second control current for proportionately adjusting its output currents, and having a common connection to said first supply terminal;

common-mode feedback means for generating said control voltage responsive to the common-mode component of the voltages at the collector electrodes of said first and second transistors, which common-mode feedback means completes degenerative feedback loops for adjusting the respective first and second output currents of said constant current generator means to substantially equal the respective collector electrode current demands of said first and second transistors; and feed forward means independent of said common-mode feedback means for concurrently adjusting said first and second control currents in response to a further control current.

10. An amplifier circuit as set forth in claim 9 wherein said constant current generator means comprises:

fifth, sixth, seventh and eighth transistors of conductivity type complementary to that of said first and second transistors, each having base and emitter and collector electrodes, having the collector electrode of said fifth transistor connecting to the emitter electrode of said sixth transistor, having the collector electrode of said seventh transistor connecting to the emitter electrode of said eighth transistor;

means for connecting the collector electrode of said sixth transistor to the first output connection of said constant current generator means;

means for connecting the collector electrode of said eighth transistor to the second output connection of said constant current generator means;

second current conductive means for connecting the respective emitter electrodes of said fifth and seventh transistors to said first supply terminal;

means for applying said control voltage to the respective base electrodes of said fifth and seventh transistors for conditioning them to supply respective collector currents; and means for applying a further control voltage to the respective base electrodes of said sixth and eighth transistors for conditioning them to conduct the respective collector currents of said fifth and seventh transistors.

11. An amplifier circuit as set forth in claim 10 wherein said feed forward means comprises:

a current conductive connection from a further output of one of said first and second current mirror amplifying means to the input connection of the other of said first and second current mirror amplifying means; and means for applying said further control current to the input connection of said one of said first and second current mirror amplifying means.

12. An amplifier circuit as set forth in claim 10 wherein said feed forward means comprises:

a current conductive connection from the first output connection of said second current mirror amplifying means to the input connection of said first current mirror amplifying means, which current conductive connection includes said second long-tailed-pair configuration and said first current conductive means; and means for applying said further control current to the input connection of said second current mirror amplifying means.

13. An amplifier circuit in accordance with claim 10 wherein said feed forward means comprises:

means for generating said further control current, which means connects between the input connection of said first current mirror amplifying means and the input connection of said second current mirror amplifying means for generating said further control current responsive to the potential therebetween.

14. An amplifier circuit as set forth in any of the preceding claims 10 through 13 wherein said common-mode feedback means includes, in addition to said third and fourth transistors operating as source followers responsive to the common-mode voltage component of the signals at the collector electrodes of said first and second transistors, the following:

offset potential generating means having a value less than the potential between the base electrodes of said fifth and seventh transistors and said first supply terminal; and means for connecting said offset potential generating means at a first of its ends to the base electrodes of said fifth and seventh transistors for supplying said control voltage and at the other of its ends to said interconnection between the respective source electrodes of said third and fourth transistors, which offset potential is poled such that the potential at said interconnection between the respective source electrodes of said third and fourth transistors with respect to said first supply terminal is substantially less than the potential at the base electrodes of said fifth and seventh transistors with respect to said first supply terminal.

15. An amplifier circuit as set forth in claim 14 wherein said offset potential generating means comprises:

semiconductor junction means having its first electrode connected to said interconnection between the respective source electrodes of said third and fourth transistors, and second electrode connected to the base electrodes of said fifth and seventh transistors; and means for supplying forward bias current to said semiconductor junction means including a current conductive connection from a further output connection of said first current mirror amplifying means to the second electrode of said semiconductor junction means.

16. An amplifier circuit as set forth in claim 15 wherein said semiconductor junction means comprises the base-emitter junction of a further transistor of like conductivity type to that of said first and second transistors, having base and emitter and collector electrodes, wherein the base and emitter electrodes of said further transistor correspond to the first and second electrodes of said semiconductor juction means, respectively, and the collector electrode of said further transistor connects to said first supply terminal.

* * * * *

UNITED STATES PATENT AND TRADEMARK OFFICE
CERTIFICATE OF CORRECTION

PATENT NO. : 4,272,728
DATED : June 9, 1981
INVENTOR(S) : Harold Allen Wittlinger It is certified that error appears in the above—identified patent and that said Letters Patent is hereby corrected as shown below:

Col. 3, Line 16 — "tolong-tailed pair" should be -- to long-tailed-pair -- ;

Col. 3, Line 23 — before "and $V_{BE10}$" insert -- $V_{BE6}$ -- ;

Col. 6, Line 14 — "ed" should be -- fed -- ;

Col. 6, Line 65 — "seccond" should be -- second -- ; and

Col. 8, Line 68 — "responsive" should be -- respective -- .

Signed and Sealed this

Twenty-second Day of December 1981

[SEAL]

Attest:

Attesting Officer

GERALD J. MOSSINGHOFF
Commissioner of Patents and Trademarks